United States Patent
Chang et al.

(10) Patent No.: US 8,663,795 B2
(45) Date of Patent: Mar. 4, 2014

(54) COATED ARTICLE AND METHOD FOR MAKING SAME

(75) Inventors: Hsin-Pei Chang, New Taipei (TW);
Wen-Rong Chen, New Taipei (TW);
Huann-Wu Chiang, New Taipei (TW);
Cheng-Shi Chen, New Taipei (TW);
Kao-Yu Liao, New Taipei (TW);
Xiao-Qing Xiong, Shenzhen (CN)

(73) Assignees: Hong Fu Jin Precision Industry (ShenZhen) Co., Ltd, Shenzhen (CN);
Hon Hai Precision Industry Co., Ltd., New Taipei (TW)

( * ) Notice: Subject to any disclaimer, the term of this patent is extended or adjusted under 35 U.S.C. 154(b) by 142 days.

(21) Appl. No.: 13/186,702

(22) Filed: Jul. 20, 2011

(65) Prior Publication Data
US 2012/0164437 A1 Jun. 28, 2012

(30) Foreign Application Priority Data
Dec. 25, 2010 (CN) .......................... 2010 1 0606825

(51) Int. Cl.
*B32B 9/00* (2006.01)

(52) U.S. Cl.
USPC .......................................... 428/336; 428/698

(58) Field of Classification Search
USPC .................................................. 428/336, 698
See application file for complete search history.

(56) References Cited

U.S. PATENT DOCUMENTS

| 4,284,687 | A  | * | 8/1981  | Dreyer et al. ................. 428/336 |
| 5,223,350 | A  | * | 6/1993  | Kobayashi et al. ........... 428/697 |
| 7,153,577 | B2 | * | 12/2006 | Wang et al. .................... 428/698 |
| 8,129,040 | B2 | * | 3/2012  | Quinto et al. ................. 428/698 |

FOREIGN PATENT DOCUMENTS

| DE | 19741800   | * | 3/1998  |
| JP | 2002-20616 | * | 7/2002  |
| JP | 2007-277019| * | 10/2007 |
| WO | 01/36341   | * | 5/2001  |

* cited by examiner

*Primary Examiner* — Archene Turner
(74) *Attorney, Agent, or Firm* — Altis Law Group, Inc.

(57) ABSTRACT

A process for coating articles is provided. The coated article includes a substrate, abase layer formed on the substrate; a chromium oxynitride layer formed on the base layer; and a silicon nitrogen layer formed on the chromium oxynitride layer. The chromium oxynitride layer and silicon nitride layer protect the substrate from oxidizing at high temperatures, extending the life of the coated article. A method for making the coated article is also described.

6 Claims, 2 Drawing Sheets

COATED ARTICLE AND METHOD FOR MAKING SAME

BACKGROUND

1. Technical Field

The present disclosure relates to a process for coating an article and a method for making the coated article.

2. Description of Related Art

Die steel is widely used in forging, stamping, cutting, die-casting and other tool-making processes. The die steel is usually required to be oxidation-resistant at high temperatures. Typically, physical vapor deposition technology has been used to manufacture coatings which are oxidation-resistant. A coating of transition metal nitride and carbide is one of the most popular choices for the surface hardening material of the die steel due to its high hardness and good chemical stability. However, there are some defects, such as high brittleness, high residual stress and poor adhesion with the substrate. When the temperature of die steel is high, a coating of transition metal nitride and carbide may nevertheless be subject to oxidization.

Therefore, there is room for improvement within the art.

BRIEF DESCRIPTION OF THE FIGURE

Many aspects of the process for coating an article and the method for making the coated article can be better understood with reference to the following drawings. The components in the drawings are not necessarily drawn to scale, the emphasis instead being placed upon clearly illustrating the principles of the coated article and the method. Moreover, in the drawings, like reference numerals designate corresponding parts throughout the several views. Wherever possible, the same reference numbers are used throughout the drawings to refer to the same or like elements of an embodiment.

DETAILED DESCRIPTION

Figure 1:
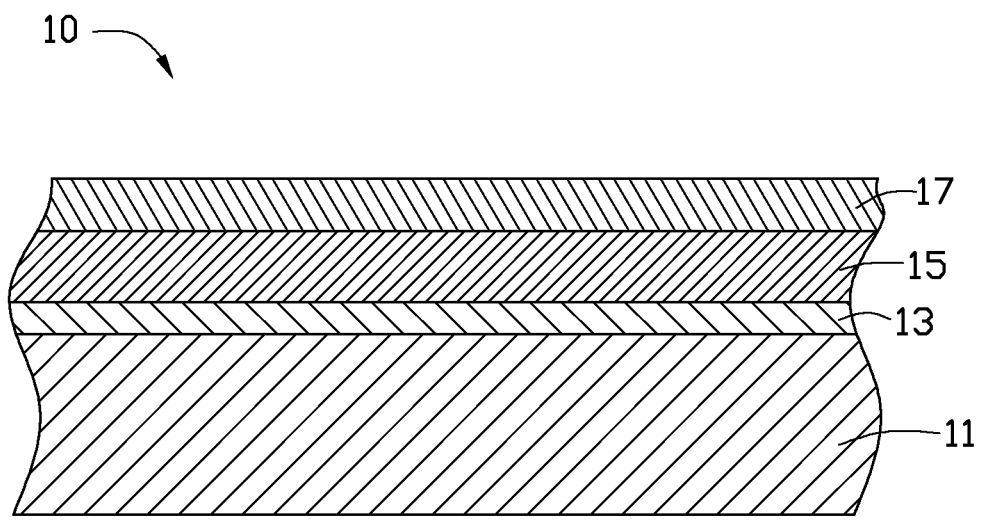
FIG. 1 is a cross-sectional view of an exemplary embodiment of a coated article.

FIG. 1 shows a coated article 10 according to an exemplary embodiment. The coated article 10 includes a substrate 11, a base layer 13 formed on the substrate 11, a chromium oxynitride (CrON) layer 15 formed on the base layer 13 and a silicon nitride (SiN) layer 17 formed on the CrON layer 15.

The substrate 11 may be made of stainless steel or die steel.

The base layer 13 is a layer of chromium. An vacuum sputtering process may form the base layer 13. The base layer 13 has a thickness of approximately 0.1 micrometers (0.1 μm) to 0.2 μm.

An vacuum sputtering process may be used to form the CrON layer 15. The CrON layer 15 has a thickness of about 0.5 μm to 1.5 μm. The CrON layer 15 is composed of small nanocrystals with a very small gap between the crystals, thus the Cr—O—N layer 15 is dense enough to delay the penetration of outside oxygen through to the substrate 11.

An vacuum sputtering process may be used to form the Si—N 17. The silicon nitride layer 17 has high hardness and good wear resistance, thus effectively protecting the Cr—O—N layer 15. The silicon nitride layer 17 has a thickness of about 0.5 μm to 1.0 μm.

The CrON layer 15 and silicon nitride layer 17 can protect the substrate 11 from oxidizing at high temperature, which effectively prolongs the service life of the coated article 10.

Figure 2:
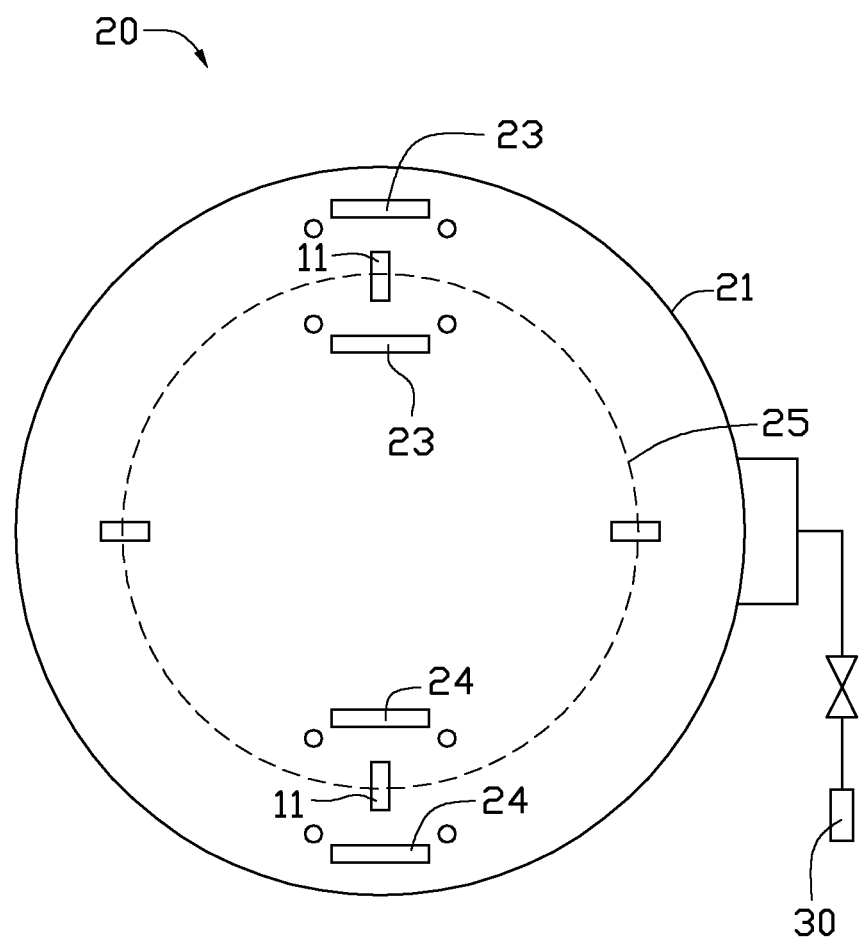
FIG. 2 is a schematic view of a vacuum sputtering device used in the coating process to create the coated article in FIG. 1.

FIG. 2 shows a vacuum sputtering device 20, which includes a vacuum chamber 21 and a vacuum pump 30 connected to the vacuum chamber 21. The vacuum pump 30 is used for evacuating the vacuum chamber 21. The vacuum chamber 21 has a number of chromium targets 23, a number of silicon targets 24 and a rotary rack (not shown) positioned therein. The rotary rack is rotated as it holds the substrate 11 (circular path 25), and the substrate 11 revolves on its own axis while it is moved along the circular path 25.

A method for making the coated article 10 may include the following steps:

The substrate 11 is pretreated, the pre-treating process may include the following steps:

The substrate 11 is positioned in an ultrasonic cleaning device (not shown) which is filled with ethanol.

The substrate 11 is plasma cleaned. The substrate 11 is positioned in the rotary rack of the vacuum chamber 21. The air in the vacuum chamber 21 is evacuated to about $3.0 \times 10^{-5}$ Pa. Argon (Ar) gas, having a purity of about 99.999%) is used as sputtering gas and is fed into the vacuum chamber 21 at a flow rate of about 500 standard-state cubic centimeters per minute (sccm). A negative bias voltage in a range of about −200 volts (V) to −500 V may be applied to the substrate 11, and high-frequency voltage is introduced in the vacuum chamber 21 and the Ar gas is ionized into plasma. The plasma strikes the surface of the substrate 11 to clean the surface of the substrate 11. The plasma cleaning of the substrate 11 may take between 3 and 10 minutes. The plasma cleaning process will enhance the bonding between the substrate 11 and the base layer 13.

The base layer 13 is vacuum sputtered onto the pretreated substrate 11. The vacuum sputtering of the base layer 13 is implemented in the vacuum chamber 21. The vacuum chamber 21 is evacuated to about $8.0 \times 10^{-3}$ Pa and heated to between about 100° C. and 150° C. Ar gas is used as the sputtering gas and is fed into the vacuum chamber 21 at flow rates of about 150 sccm to 200 sccm. The chromium targets 23 are subjected to between about 8 kw and 10 kw of electrical power. A negative bias voltage between about −150V and −250V is applied to the substrate 11 and the duty cycle is about 50%. The depositing of the base layer 13 may take about 5 to 10 minutes. The base layer 13 has a thickness of about 0.1 μm to 0.2 μm.

The CrON layer 15 is vacuum sputtered onto the base layer 13. The vacuum sputtering of the CrON layer 15 is implemented in the vacuum chamber 21. Oxygen ($O_2$) and nitrogen ($N_2$) are used as reaction gases and these are fed into the vacuum chamber 21 at flow rates of about between 40 sccm and 80 sccm and about 30 sccm and 60 sccm, respectively, otherwise the conditions are the same as for the vacuum sputtering of the base layer 13. The depositing of the CrON layer 15 takes between about 30 min and 60 min. The CrON layer 15 is formed by a magnetron sputtering process and has a thickness of about 0.5 μm to 1.5 μm.

The silicon nitride layer 17 is vacuum sputtered onto the CrON layer 15. The vacuum sputtering of the silicon nitride layer 17 is implemented in the vacuum chamber 21. Nitrogen is the reaction gas and is fed into the vacuum chamber 21 at flow rates of about 60 sccm to 120 sccm, and Ar gas is used as the sputtering gas, being fed into the vacuum chamber 21 at flow rates of about 150 sccm to 200 sccm. The silicon targets are subject to from about 4 kw to 6 kw of electrical power. And the duty cycle is about 50%. A negative bias voltage of about −30 V to −50 V is applied to the substrate 11. The depositing of the silicon nitride layer 17 may takes about 1 hour to 2 hours. The silicon nitride layer 17 has a thickness of about 0.5 µm to 1.0 µm.

EXAMPLES

Some experimental examples of the present disclosure are described as follows.

Example 1

The vacuum sputtering device 20 in example 1 is a medium frequency magnetron sputtering device (model No. SM-1100H) manufactured by South Innovative Vacuum Technology Co., Ltd.

The substrate 11 is made of 316 stainless steel.

Plasma cleaning: Ar gas is fed into the vacuum chamber 21 at a flow rate of about 500 sccm. A negative bias voltage of about −500 V is applied to the substrate 11. The plasma cleaning of the substrate 11 took 10 min.

Sputtering to form the base layer 13: The vacuum chamber 21 is heated to about 120° C. Ar gas is fed into the vacuum chamber 21 at a flow rate of about 150 sccm. The chromium targets 23 are subjected to about 9 kw of electrical power and a negative bias voltage of about −200 V is applied to the substrate 11. The depositing of the base layer 13 took about 5 min. The base layer 13 had a thickness of about 0.1 µm.

Sputtering to form the CrON layer 15: Oxygen and nitrogen are fed into the vacuum chamber 21 at flow rates of about 80 sccm and 60 sccm, respectively; otherwise conditions are the same as for the vacuum sputtering of the base layer 13. The depositing of the CrON layer 15 took about 30 min. The CrON layer 15 had a thickness of about 0.5 µm.

Sputtering of the silicon nitride layer 17: Ar gas and nitrogen are fed into the vacuum chamber 21 at flow rates of about 150 sccm and 120 sccm, respectively. The silicon targets 24 are subjected to 4 kw of electrical power and a negative bias voltage of about −50 V is applied to the substrate 11. The depositing of the silicon nitride layer 17 took about 60 min. The silicon nitride layer 17 had a thickness of about 0.5 µm.

Example 2

The vacuum sputtering device 20 used in example 2 is the same in example 1.

The substrate 11 is made of 316 stainless steel.

Plasma cleaning: Ar gas is fed into the vacuum chamber 21 at a flow rate of about 500 sccm. A negative bias voltage of about −500 V was applied to the substrate 11. The plasma cleaning of the substrate 11 took about 10 min.

Sputtering to form the base layer 13: The vacuum chamber 21 is heated to about 120° C. Ar gas is fed into the vacuum chamber 21 at a flow rate of about 150 sccm. The chromium targets 23 are subjected to about 8 kw of electrical power. A negative bias voltage of about −200 V was applied to the substrate 11. The depositing of the base layer 13 took about 10 min. The base layer 13 had a thickness of about 0.2 µm.

Sputtering of the CrON layer 15: Oxygen and nitrogen are fed into the vacuum chamber 21 at flow rates of about 40 sccm and 30 sccm, respectively; other experiment conditions is the same with vacuum sputtering of the base layer 13. The depositing of the CrON layer 15 took about 60 min. The CrON layer 15 had a thickness of about 1.0 µm.

Sputtering to form the silicon nitride layer 17: Ar gas and nitrogen are fed into the vacuum chamber 21 at flow rates of about 150 sccm and 80 sccm, respectively. The silicon targets are subjected to about 5 kw of electrical power and a negative bias voltage of about −50 V was applied to the substrate 11. The depositing of the silicon nitride layer 17 took about 90 min. The silicon nitride layer 17 had a thickness of about 0.8 µm.

Results of the Above Examples

The coated articles 10 made in examples 1 and 2 were subjected to a high-temperature oxidation test and an abrasion test.

High-temperature oxidation test: a tube furnace applied a heating rate was 10° C./min, heating temperature was about 800° C., the holding time was about 10 h. The coated articles 10 made in example 1 and 2 both displayed no oxidation and no peeling.

Abrasion test: a linear wear tester applied a load of about 1 kg, the stroke length was 2.0 inch, the wear rate was 25 times/min. The coated articles 10 made in example 1 and 2 both showed no peeling after 1 min.

It is believed that the exemplary embodiment and its advantages will be understood from the foregoing description, and it will be apparent that various changes may be made thereto without departing from the spirit and scope of the disclosure or sacrificing all of its advantages, the examples hereinbefore described merely being preferred or exemplary embodiment of the disclosure.

What is claimed is:

1. A coated article, comprising:
   a substrate;
   a base layer formed on the substrate;
   a chromium oxynitride layer directly formed on the base layer;
   a silicon nitride layer directly formed on the chromium oxynitride layer.

2. The coated article as claimed in claim 1, wherein the substrate is made of stainless steel or die steel.

3. The coated article as claimed in claim 1, wherein the base layer is a chromium layer formed by magnetron sputtering process and has a thickness of about 0.1 µm to 0.2 µm.

4. The coated article as claimed in claim 1, wherein the chromium oxynitride layer is formed by magnetron sputtering process and has a thickness of about 0.5 µm to 1.5 µm.

5. The coated article as claimed in claim 1, wherein the silicon nitride layer is formed by magnetron sputtering process and has a thickness of about 0.5 µm to 1.5 µm.

6. The coated article as claimed in claim 1, wherein the chromium oxynitride layer is made of nanocrystals.

* * * * *